US010049886B2

(12) United States Patent
Lin et al.

(10) Patent No.: US 10,049,886 B2
(45) Date of Patent: Aug. 14, 2018

(54) SYSTEM AND METHOD FOR DAMAGE REDUCTION IN LIGHT-ASSISTED PROCESSES

(71) Applicant: Taiwan Semiconductor Manufacturing Company, Ltd., Hsin-Chu (TW)

(72) Inventors: Yi-Hung Lin, Taipei (TW); Sheng-Shin Lin, New Taipei (TW); Ying-Chieh Hung, Hsin-Chu (TW); Yu-Ting Huang, Hsin-Chu (TW); Tze-Liang Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/528,938

(22) Filed: Oct. 30, 2014

(65) Prior Publication Data

US 2016/0126105 A1  May 5, 2016

(51) Int. Cl.
*H01L 21/31* (2006.01)
*H01L 21/3105* (2006.01)
*H01L 23/532* (2006.01)
*H01L 21/768* (2006.01)

(52) U.S. Cl.
CPC .... *H01L 21/3105* (2013.01); *H01L 21/76814* (2013.01); *H01L 21/76825* (2013.01); *H01L 21/76826* (2013.01); *H01L 23/5329* (2013.01); *H01L 23/53295* (2013.01); *H01L 2924/0002* (2013.01)

(58) Field of Classification Search
CPC ........... H01L 21/3105; H01L 21/76825; H01L 21/76826; H01L 21/76813; H01L 21/76814; H01L 21/67115

USPC ..................................... 438/4, 778, 795, 798
See application file for complete search history.

(56) References Cited

U.S. PATENT DOCUMENTS

| 8,454,750 | B1 | 6/2013 | Shrinivasan et al. |
| 9,029,171 | B2 | 5/2015 | Huang et al. |
| 2008/0311728 | A1 | 12/2008 | Asako et al. |
| 2011/0111533 | A1 | 5/2011 | Varadarajan et al. |
| 2011/0117678 | A1* | 5/2011 | Varadarajan ........ H01L 21/3105 438/4 |

FOREIGN PATENT DOCUMENTS

| CN | 103515303 | 1/2014 |
| JP | 2010133714 | 8/2013 |
| KR | 1020110052436 | 10/2002 |
| KR | 1020080100521 | 6/2012 |

OTHER PUBLICATIONS

Sakai Chemical Industry Co., Ltd., Microfine Titanium Dioxides as UV Filter, Aug. 2, 2010.*
Schott, "Interference Filters & Special Filters", Dieletric mirror coatings, Description—2013, 36 pages.

* cited by examiner

*Primary Examiner* — Brook Kebede
(74) *Attorney, Agent, or Firm* — Slater Matsil, LLP

(57) ABSTRACT

A method embodiment for forming a semiconductor device includes providing a dielectric layer having a damaged surface and repairing the damaged surface of the dielectric layer. Repairing the damaged surface includes exposing the damaged surface of the dielectric layer to a precursor chemical, activating the precursor chemical using light energy, and filtering out a spectrum of the light energy while activating the precursor chemical.

20 Claims, 8 Drawing Sheets

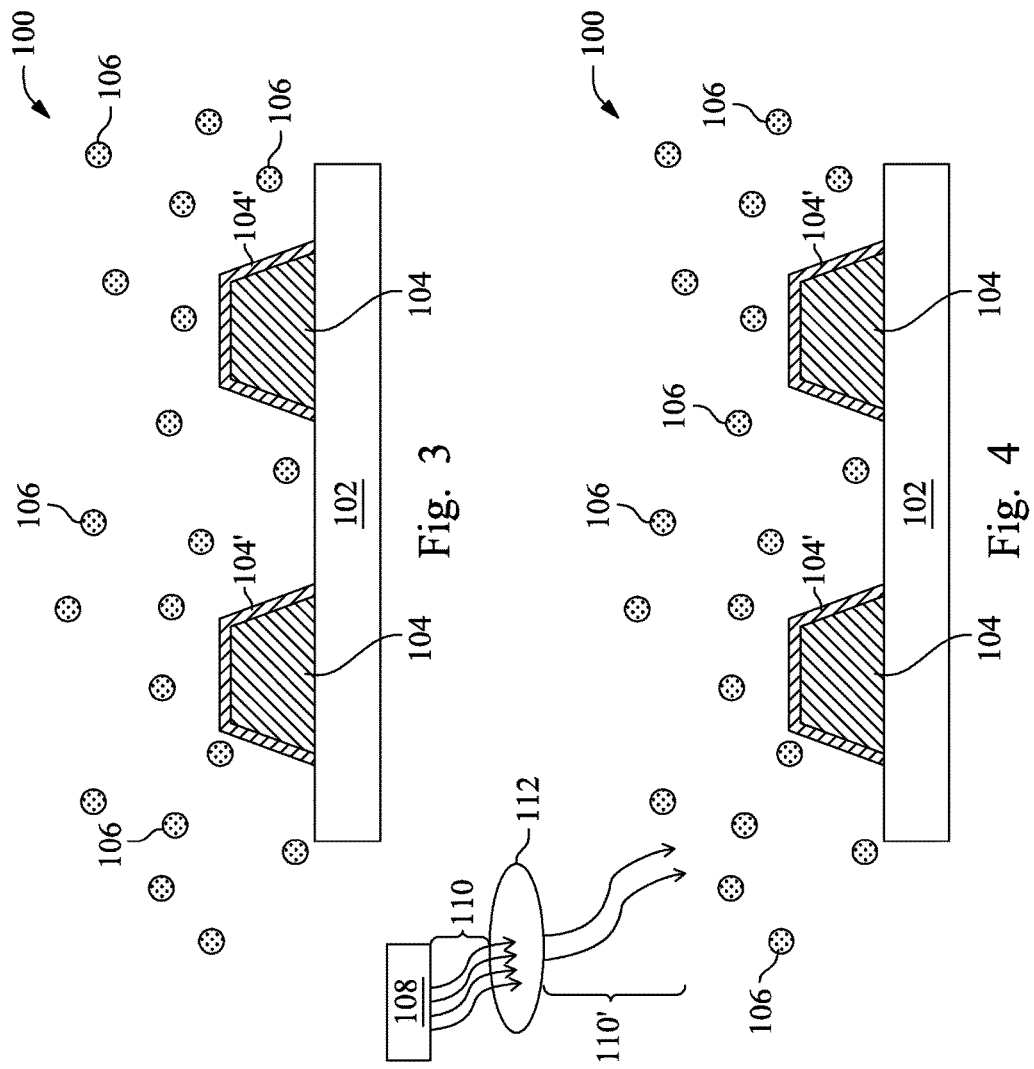

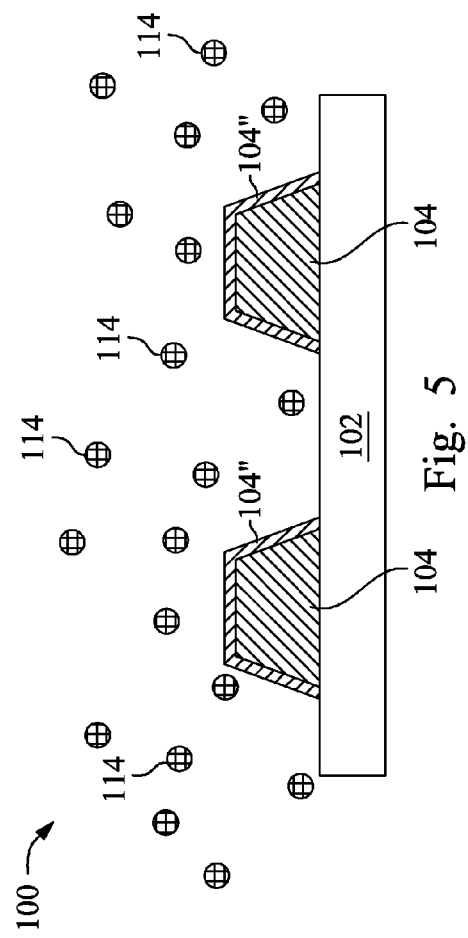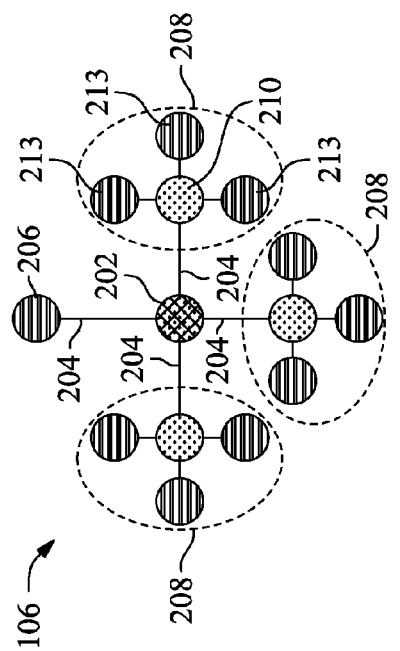

SYSTEM AND METHOD FOR DAMAGE REDUCTION IN LIGHT-ASSISTED PROCESSES

BACKGROUND

An important objective in the advancement of integrated circuit (IC) technology is the reduction of IC dimensions. Such reduction of IC dimensions reduces area capacitance and is critical to increasing the performance of integrated circuits. Moreover, reducing the area of an IC die leads to higher yield in IC fabrication. Such advantages are among the driving forces to constantly scale down IC dimensions.

As the density of semiconductor devices increases, however, the resistance capacitance (RC) delay time increasingly dominates the circuit performance. To reduce the RC delay, there is a desire to switch from conventional dielectrics to low-k dielectrics, which have a dielectric constant less than silicon dioxide ($SiO_2$), or about 4.0. Low-k dielectrics may also include a class of low-k dielectrics frequently called extreme low-k (ELK) dielectrics, which have a dielectric constant less than about 2.5 or even about 2.0. Low-k materials are particularly useful as intermetal dielectrics (IMDs) and as interlayer dielectrics (ILDs). Despite their advantages, low-k materials raise many problems relating to their integration into conventional processing methods.

For example, many processing methods are used to pattern low-k materials (e.g., etching, chemical mechanical polish (CMP), and the like) for the formation of conductive interconnect structures or other structures in an IC device. These processes may cause surface damage to low-k materials because low-k materials tend to be softer, less chemically stable, more porous, or any combination of these factors. The damaged surface manifests itself in higher leakage currents, lower breakdown voltages, undesirable hydrophilic traits, and changes in the dielectric constant associated with the low-k dielectric material. Some damaged low-k dielectric surfaces may also lead to further processing problems (e.g., deformation during exposure to wet chemical cleanups, pattern misalignment, and the like) in subsequent processing steps.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 5 illustrate cross-sectional views of various intermediary steps of manufacturing a semiconductor device in accordance with some embodiments.

FIGS. 6 through 11 illustrate a chemical reaction used to process a dielectric layer in accordance with some embodiments.

DETAILED DESCRIPTION

Figure 1:
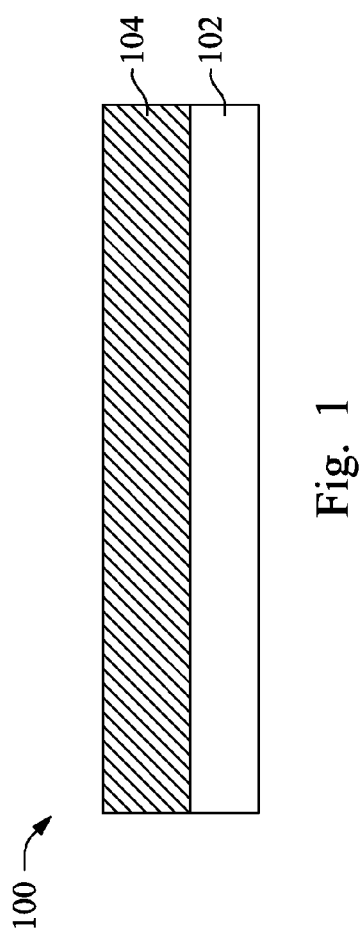

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments are described in a specific context, namely processing of dielectric layers (e.g., comprising a low-k dielectric material) in an integrated circuit device having a semiconductor substrate and active devices. Various embodiments may also be applied, however, to any processing of dielectric layers.

Various embodiments include repairing a damaged dielectric surface using a suitable precursor chemical. For example, a dielectric layer, which may comprise a low-k dielectric material, may be processed (e.g., etched, planarized, and the like) during the fabrication of an integrated circuit (IC) device, and such processing techniques may cause damage to an exposed surface of the dielectric layer. Subsequently, additional processing may include repairing the damaged surface by flowing a precursor chemical over the damaged surface and activating the precursor chemical (e.g., using light energy). The activated precursor chemical reacts with the damaged surface of the dielectric layer to improve the damaged surface's chemical properties.

In some embodiments, the light energy used to activate the precursor chemical is filtered ultraviolet light that selectively activates the precursor chemical while causing minimal (or at least fewer) chemical reactions in undamaged portions (e.g., unexposed portions) of the dielectric layer. For example, an optical filter may be—applied to the light energy's source to filter out high-energy photons that cause a reaction in the underlying dielectric layer while still providing sufficient energy to activate the precursor chemical and repair the damaged surface. Thus, a dielectric surface may be repaired while reducing the risk of further damage to the underlying, bulk dielectric material.

Referring now to FIG. 1, a cross-sectional view of a semiconductor device 100 is provided. Semiconductor device 100 may include a substrate 102 and a dielectric layer 104 disposed over substrate 102. Substrate 102 comprises, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, substrate 102 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Active devices (not illustrated) such as transistors, capacitors, resistors, diodes, photo-diodes, fuses, and the like may be formed at the top surface of substrate 102.

Dielectric layer 104 is disposed over substrate 102. Dielectric layer 104 may be an inter-layer dielectric (ILD) or an inter-metal dielectric (IMD) layer. Dielectric layer 104 may comprise a low-k dielectric having a k-value, for example, lower than about 4.0 or even 2.0. In some embodiments, dielectric layer 104 may comprise, for example, combinations of silicon (Si) and oxygen (O) bonds, Si and carbon (C) bonds, C and hydrogen (H) bonds, O and H bonds, and/or the like. Dielectric layer 104 is formed by any suitable method, such as spinning, chemical vapor deposition (CVD), and plasma-enhanced CVD (PECVD). Additionally, in some embodiments, dielectric layer 104 may also include pores (not shown) to further reduce the k-value of the dielectric material. Such pores may be formed using any suitable method, such as, depositing a porogen-containing dielectric material and then performing a curing process to drive out the porogen, and hence the remaining dielectric layer 104 becomes porous. Although FIG. 1 illustrates dielectric layer 104 as directly above and contacting substrate 102, there may be any number of additional layers (e.g., other dielectric layers having conductive interconnect features, etch stop layers, isolation layers, buffer layers, and the like) disposed between dielectric layer 104 and substrate 102.

Figure 2:
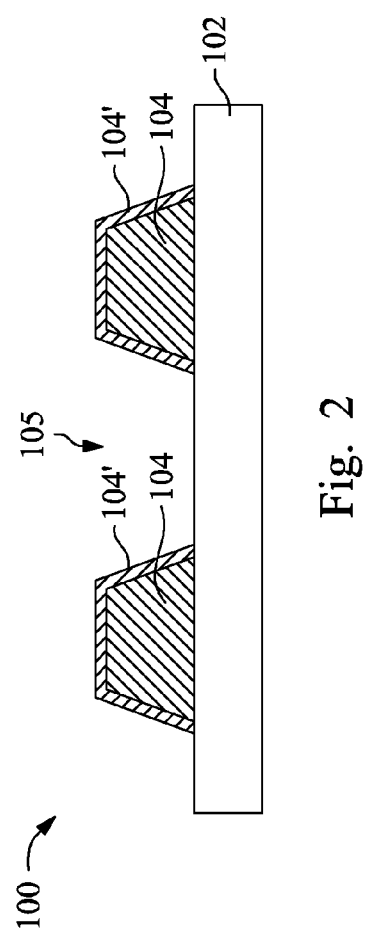

Subsequently, dielectric layer 104 may be processed during the fabrication of additional features in semiconductor device 100. For example, FIG. 2 illustrates the patterning of dielectric layer 104 to form one or more openings 105 extending therethrough using, for example, photolithography and etching processes. The etching of dielectric layer 104 may cause damage to exposed surfaces (e.g., top surface and sidewalls) of dielectric layer 104. Alternatively, exposed surfaces of dielectric layer 104 may be damaged using another process (e.g., chemical mechanical polishing (CMP)). This damage is illustrated in FIG. 2 by damaged surface 104'. In some embodiments, the damage can be attributed, at least in part, to the bonding of oxygen-hydrogen (OH) groups with the low-k material of dielectric layer 104 in damaged surface 104' (see e.g., FIG. 9), which may be caused by the chemicals (e.g., chemical etchants and/or slurries) used to process dielectric layer 104. The bonding of OH groups may cause undesirable hydrophilic traits and increases in the dielectric constant associated with the low-k dielectric material in damaged surface 104'.

The pattern of dielectric layer 104 illustrated in FIG. 2 is merely for ease of discussion, and dielectric layer 104 may have any configuration after processing. For example, if a CMP process is applied, the thickness of dielectric layer 104 may merely be reduced and openings 105 may not be formed. In such embodiments, damaged surface 104' may be disposed solely on a top surface, not sidewalls, of dielectric layer 104.

FIGS. 3 through 4 illustrate cross-sectional views of intermediary steps of repairing damaged surface 104'. Referring first to FIG. 3, damaged surface 104' is exposed to a precursor chemical 106. For example, semiconductor device 100 may be placed in a suitable process chamber (not shown), and precursor chemical 106 may be flowed over damaged surface 104' in gaseous form at a rate of about 1.5 standard cubic centimeters per minute (sccm) to about 4000 sccm. As will be explained in greater detail in subsequent paragraphs, precursor chemical 106 may be any chemical suitable for removing the undesirable OH bonds in damaged surface 104' (or to otherwise improve the chemical properties of damaged surface 104'). For example, precursor chemical 106 may be a silicon and hydrogen containing organic compound such as trimethylsilane ($SiH(CH_3)_3$), monomethylsilane ($SiH(CH_3)$), and the like.

FIG. 4 illustrates the activation of precursor chemical 106 by applying a suitable level of activation energy 110' to activate precursor chemical 106 and trigger a chemical reaction for repairing damaged surface 104'. For example, activation energy 110' may trigger precursor chemical 106 to react with damaged surface 104' and improve the surface characteristics of damaged surface 104' (e.g., by removing undesirable OH group bonds). An example reaction triggered by the use of this activation energy will be explained in greater detail in subsequent paragraphs.

In some embodiments, activation energy 110' is ultraviolet light supplied by a light source 108, which may provide the entire spectrum of ultraviolet light energy as indicated by arrows 110. For example, light source 108 may be a mercury lamp, which may supply ultraviolet light energy having a wavelength of about 250 nanometers (nm) to about 600 nm. In addition to activating precursor chemical 106, undesirable chemical reactions may be triggered in the bulk, undamaged portions of dielectric layer 104 (e.g., unexposed portions of dielectric layer 104) when dielectric layer 104 is exposed to the full spectrum of ultraviolet light energy 110. For example, when dielectric layer 104 is exposed to the full spectrum of ultraviolet light energy 110, chemical bonds (e.g., Si and C bonds, O and H bonds, and the like) in the low-k material of dielectric layer 104 may be broken. These broken bonds may decompose and densify the low-k material of dielectric layer 104. Thus, in various embodiments, the ultraviolet light spectrum provided by light source 108 is filtered to avoid (or at least reduce) such undesirable chemical reactions in the low-k material of dielectric layer 104 while still providing sufficient energy to activate precursor 106 and repair damaged surface 104'. In FIG. 4, the filtered ultraviolet spectrum is indicated by arrows 110'.

In some embodiments, an optical filter 112 may be applied to light source 108 to filter the full spectrum of ultraviolet light energy 110. For example, optical filter 112 may absorb a portion of the full spectrum of ultraviolet light energy 110 so that only a suitable amount of activation energy 110' passes through to activate precursor chemical 106. In alternative embodiments, optical filter 112 may reflect, rather than absorb, undesired portions of the full spectrum of ultraviolet light energy 110 away from precursor chemical 106/dielectric layer 104.

The amount of light energy 110 filtered by optical filter 112 may depend on the composition of precursor chemical 106. For example, in embodiments where precursor chemical 106 is a silicon and hydrogen containing organic compound, it has been observed that filtering out photons having energy higher than about 3.1 electron volts (eV) or a wavelength less than about 400 nanometers (nm) may eliminate (or at least reduce) undesirable reactions in dielectric layer 104 while still activating precursor chemical 106 to repair damaged surface 104' as will be explained in greater detail in subsequent paragraphs. That is, in embodiments when precursor chemical is a silicon and hydrogen comprising organic compound (e.g., $SiH(CH_3)_3$), activation energy 110' may only include photons having energy less than about 3.1 eV and/or wavelengths greater than about 400 nm. In such embodiments, optical filter 112 may comprise a layer of titanium oxide (TiO) to absorb undesired portions of the full ultraviolet light spectrum 110 (e.g., photons having energy greater than about 3.1 eV or wavelengths less than about 400 nm). Other suitable filters may also be used (e.g., reflective filters and/or other absorption filters).

FIG. 5 illustrates a cross-sectional view after damaged surface 104' is repaired. For example, due to activation energy 110', precursor chemical 106 and damaged surface 104' chemically react and result in repaired surface 104" and (optionally) byproduct 114. For example, undesirable OH bonds in damaged surface 104' may be replaced by a chemical compound resulting from a chemical reaction between such OH bonds and activated precursor chemical 106. Repaired surface 104" may exhibit improved chemical properties, such as less hydrophilic properties and/or improved k-values. For example, in experiments conducted using the repair process described above, the binding energy of C atoms in repaired surface 104" may shift from about 292.9 eV to about 291.3 eV and the binding energy of Si may shift from about 111.3 eV to about 110.6 eV compared to damaged surface 104'. It has also been observed that repaired surface 104" may be denser than damaged surface 104" as a result of the repair process. For example, in some embodiments, the density of repaired surface 104" may be increased by about 15% and the thickness of repaired surface 104" may decreased by about 10% compared to damaged surface 104'. However, the density and/or thickness of underlying bulk, dielectric layer 104 may remain substantially unchanged even after the repair operation. Thus, repaired surface 104" may have a greater density than underlying dielectric layer 104. For example, a ratio of a density of the repaired surface 104" to underlying dielectric layer 104 may be greater than about 1.9 (e.g., between about 1.0 to about 2.0). It has been observed that when the densities between repaired surface 104" and underlying dielectric layer 104 falls within this range, improved chemical properties are achieved in the repaired surface 104" without undesirable properties (e.g., increased density and/or shrinkage) in underlying dielectric layer 104.

After damaged surface 104' is repaired, additional features in semiconductor device 100 may be formed. For example, interconnect structures (not shown) may be formed in dielectric layer 104 and/or additional dielectric layers, input/output (IO) structures, passivation layers, packaging structures, and the like (not shown) formed over dielectric layer 104. Similar repair processes may be applied to other dielectric layers as desired in semiconductor device 100

Subsequently formed interconnect structures may include various conductive lines and/or vias comprising copper, aluminum, nickel, tungsten, gold, combinations thereof, and the like formed using any suitable method. In some embodiments, the interconnect structures may be formed, for example, by first depositing a seed layer in a patterned dielectric layer (e.g., in openings 105, see FIG. 2) and an electrochemical plating process. The interconnect structure electrically connects various active devices to form functional circuits within semiconductor device 100. The functions provided by such circuits may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

FIGS. 6 through 11 illustrate a more detailed description of an example chemical reaction for repairing a damaged dielectric surface (e.g., damaged surface 104') in accordance with some embodiments. FIG. 6 illustrates the molecular composition of an example precursor chemical 106 in accordance with some embodiments. In FIG. 6, precursor chemical 106 is illustrated as a silicon and hydrogen containing organic compound (SiHR), specifically trimethylsilane (SiH $(CH_3)_3$). That is, in FIG. 6, the organic compound, R, is $(CH_3)_3$.

Specifically, in FIG. 6, precursor chemical 106 includes a silicon atom 202 sharing four covalent bonds 204 with a hydrogen atom 206 and three methyl groups 208. Each methyl group 208 comprises a carbon atom 210 bonded to three hydrogen atoms 213. Carbon atom 210 in each methyl group 208 further shares a covalent bond 204 with silicon atom 202. Although FIG. 6 illustrates precursor chemical 106 having a specific configuration, other atomic configurations may be used as well. For example, in alternative embodiments, silicon atom 202 may be bonded a different number of methyl groups 208 (e.g., monomethylsilane).

Figure 7:
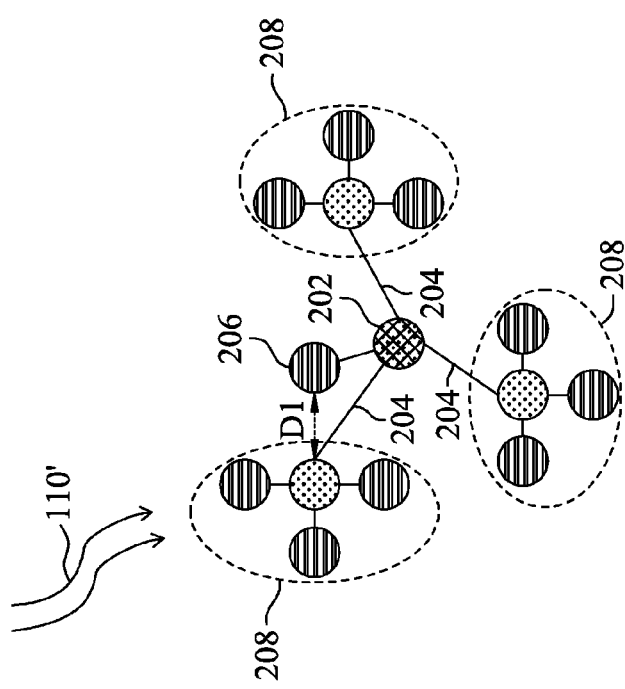
Figure 8:
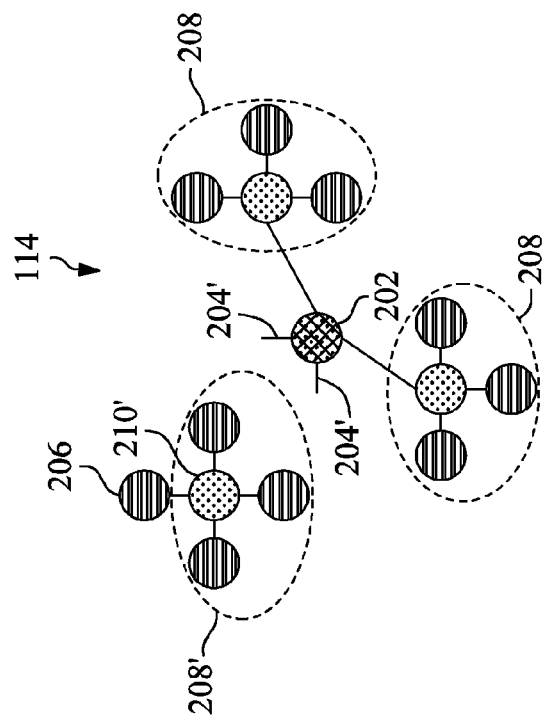

FIGS. 7 and 8 illustrate the activation of precursor chemical 106 by activation energy 110'. In some embodiments, the activation energy 110' triggers a self-decomposition reaction in precursor chemical 106, which is described in greater detail in FIGS. 7 and 8. First, referring to FIG. 7, in various embodiments, the supplied activation energy 110' (hv) bends the angle of covalent bonds 204 shared between silicon atom 202 and hydrogen atom 206/carbon atom 210 (of methyl groups 208). This bond bending phenomena is illustrated pictorially in FIG. 7. In some embodiments, the bond bending triggered by activation energy 110' may cause a distance D1 between hydrogen atom 206 and a carbon atom 210 of at least one methyl group 208 to decrease.

Generally, activation energy 110' may not be sufficient to outright break the covalent bonds 204 shared between silicon atom 202 and hydrogen atom 206 or methyl groups 208. Rather, the supplied activation energy 110' bends covalent bonds 204 to move hydrogen atom 206 closer to a methyl group 208. Activation energy 110' may be sufficient to trigger this reaction without triggering additional, undesirable chemical reactions (e.g., breaking bonds) in precursor chemical 106 and/or dielectric layer 104 (see FIG. 4). Thus, in various embodiments, the supplied activation energy 110' may not be the entire spectrum of ultraviolet light energy. For example, for the reaction illustrated in FIG. 7, activation energy 110' may be filtered and only include a spectrum of ultraviolet light having energy less than about 3.1 eV and/or wavelengths greater than about 400 nm. In such embodiments, optical filter 112 (see FIG. 4) may be applied to an ultraviolet light source and absorb and/or reflect photons having energy greater than about 3.1 eV and/or wavelengths less than about 400 nm.

Next, referring to FIG. 8, hydrogen atom 206 bonds with a methyl group 208 (labeled 208'). Due to the bending of covalent bonds 204 triggered by activation energy 110, the distance D1 (see FIG. 7) between hydrogen atom 206 and a carbon atom 210 (labeled 210') is decreased. In some embodiments, distance D1 is decreased to be substantially equal to the bond length of a carbon atom with a hydrogen atom in methane, which may trigger carbon atom 210' and hydrogen atom 206 to bond. Thus, the bending of covalent bonds 204 (caused by activation energy 110') may trigger a self-decomposition reaction involving the bonding of hydrogen atom 206 and carbon atom 210'. As a result of this chemical reaction (caused by decreasing distance D1), bonds 204 between silicon atom 202 and hydrogen atom 206/carbon atom 210' are broken, and the resulting silicon atom 202 includes two radical sites 204'. Radical sites 204' exist due to the chemical properties (e.g., the number of electrons in outer orbitals) of silicon atom 202. Methyl group 208' bonds with hydrogen atom 206 (as illustrated by dashed arrow 211) to form byproduct 114, which in FIG. 8 is methane (CH$_4$). The entire activation reaction illustrated by FIGS. 7 and 8 can be expressed chemically as:

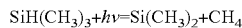

After activation, the resulting activated precursor chemical 106' includes silicon atom 202 bonded to two methyl groups 208 and having two radical sites 204'. Also produced is byproduct 114, which in the reactions illustrated by FIGS. 7 and 8, is methane (CH$_4$).

Figure 9:
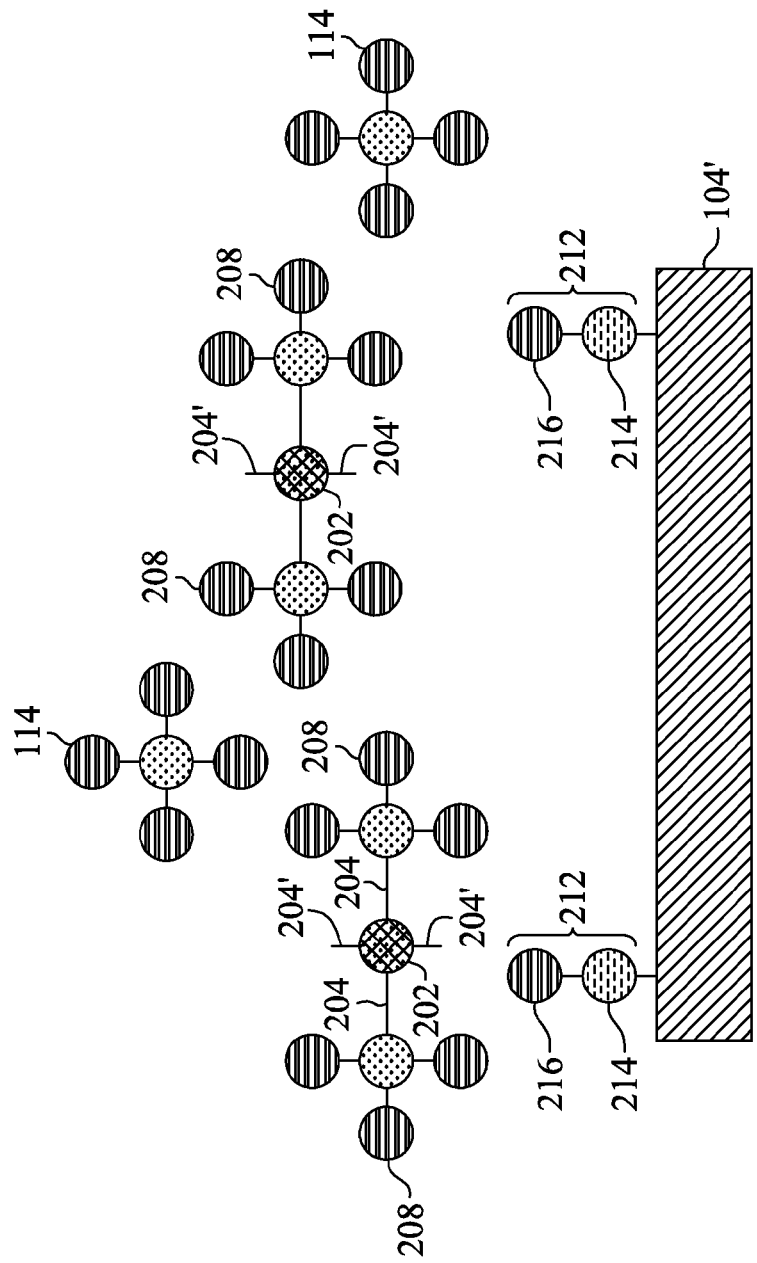

FIG. 9 illustrates damaged surface 104' exposed to the activated precursor chemical 106' (e.g., Si(CH$_3$)$_2$+CH$_4$). As further illustrated by FIG. 9, damaged surface 104' includes undesirable OH group 212 bonded to the dielectric material of damaged surface 104'. Each OH group 212 includes an oxygen atom 214 sharing a covalent bond with the dielectric material of damaged surface of 104'. Oxygen atom 214 further shares a covalent bond with a hydrogen atom 216. OH group 212 may cause undesirable properties in damaged surface 104', such as, hydrophilic properties, increased k-values, and the like. FIG. 9 illustrates particular number of OH groups 212 and activated precursor chemicals 106 (i.e., two) for ease of illustration only. One of ordinary skill in the art would recognize that the number of OH group bonds 212 and activated precursor chemicals 106 disposed with a damaged surface 104' may be much higher.

Figure 10:
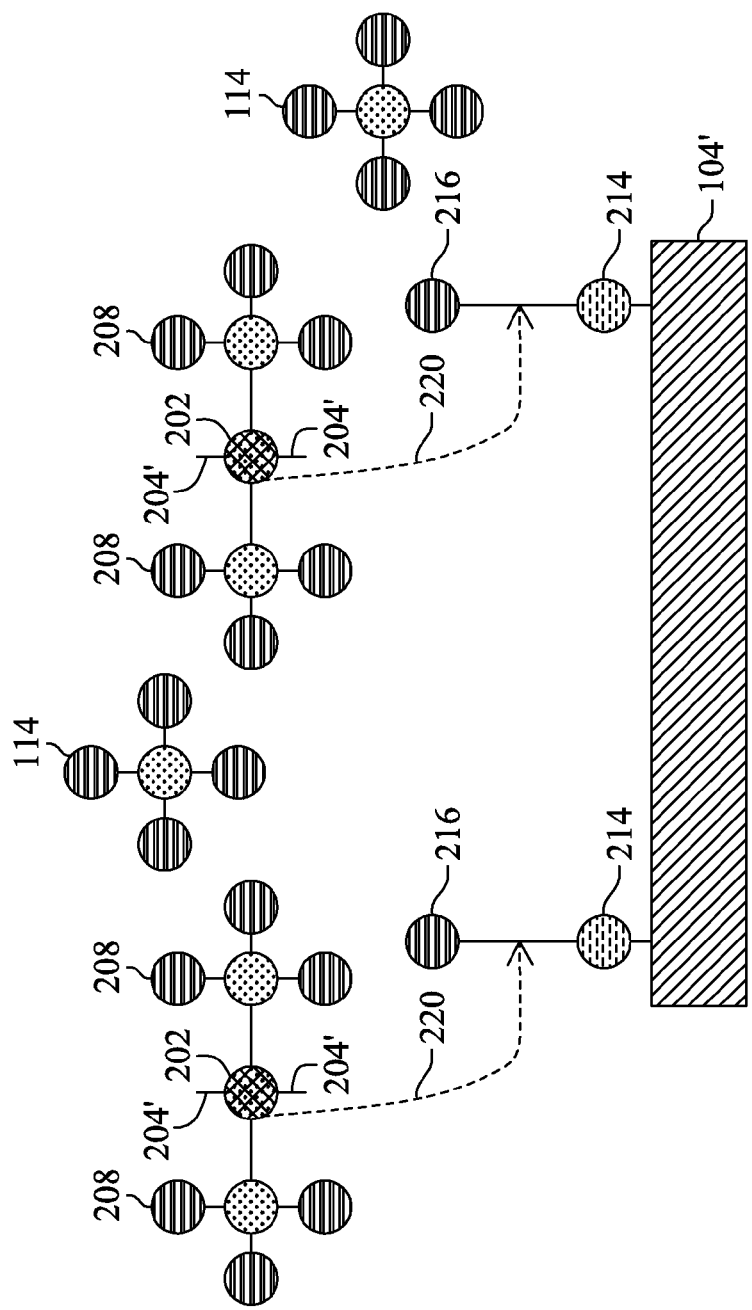
Figure 11:
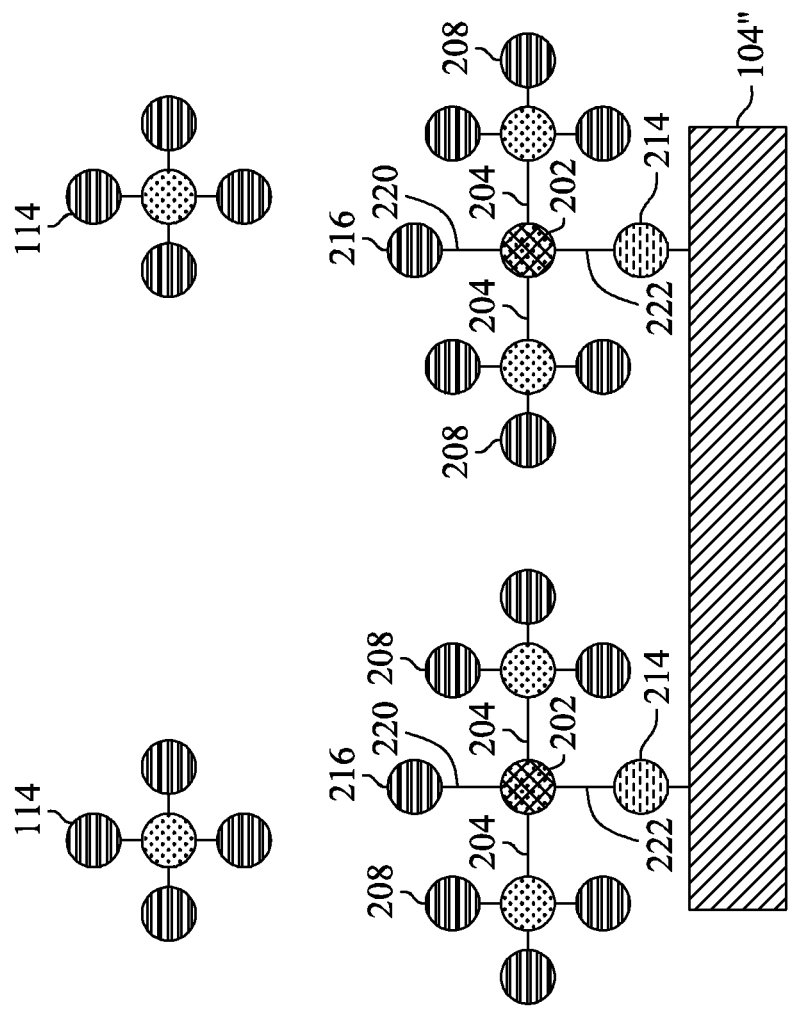

FIGS. 10 and 11 illustrate an example chemical reaction for the removal of OH groups 212 from damaged surface 104'. In some embodiments, the removal of OH groups 212 is triggered by a spontaneous reaction (e.g., an exothermic reaction) between OH groups 212 and the activated precursor chemical 106, which is described in greater detail in FIGS. 10 and 11. Referring first to FIG. 10, silicon atom 202 (of activated precursor chemical 106') is inserted between hydrogen atom 216 and oxygen atom 214 (of OH group 212) as indicated by dashed arrows 220.

Referring next to FIG. 11, oxygen atom 214 and hydrogen atom 216 is bonded to radical sites 204' of silicon atom 202. Thus, the covalent bond shared by oxygen atom 214 and hydrogen atom 216 is broken, and bonded OH groups 212 are removed from damaged surface 104'. The chemical reaction illustrated by FIGS. 10 and 11 can be expressed as:

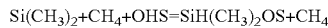

where S is the dielectric material (e.g., a low-k dielectric) of damaged surface 104'. In various embodiments, this exothermic chemical reaction may be triggered due to the availability of radical sites 204' on silicon atom 202 (see FIG. 10). Because covalent bond 218 between hydrogen atom 216 and silicon atom 202 is more chemically stable than the covalent bond previously shared between hydrogen atom 216 and oxygen atom 214 (see FIG. 9), hydrogen atom 216 will be triggered to form a bond with silicon atom 202 as indicated by arrow 220 instead of remaining bonded with oxygen atom 214.

Thus, as illustrated by FIGS. 10 and 11, at least a portion of the activated precursor chemicals 106 (e.g., Si(CH$_3$)$_2$) chemically react with OH groups 212, and such OH groups 212 are replaced with SiH(CH$_3$)$_2$O, which repairs damaged surface 104'. Silicon atom 202 is inserted between oxygen atom 214 and hydrogen atom 216 of OH groups 212, thus removing OH groups 212 bonds from damaged surface 104'. The chemical reactions illustrated by FIGS. 7 through 11 may also result the creation of byproduct 114 (e.g., methane), and byproduct 114 may be removed prior to the formation of additional features in semiconductor device 100.

Figure 12:
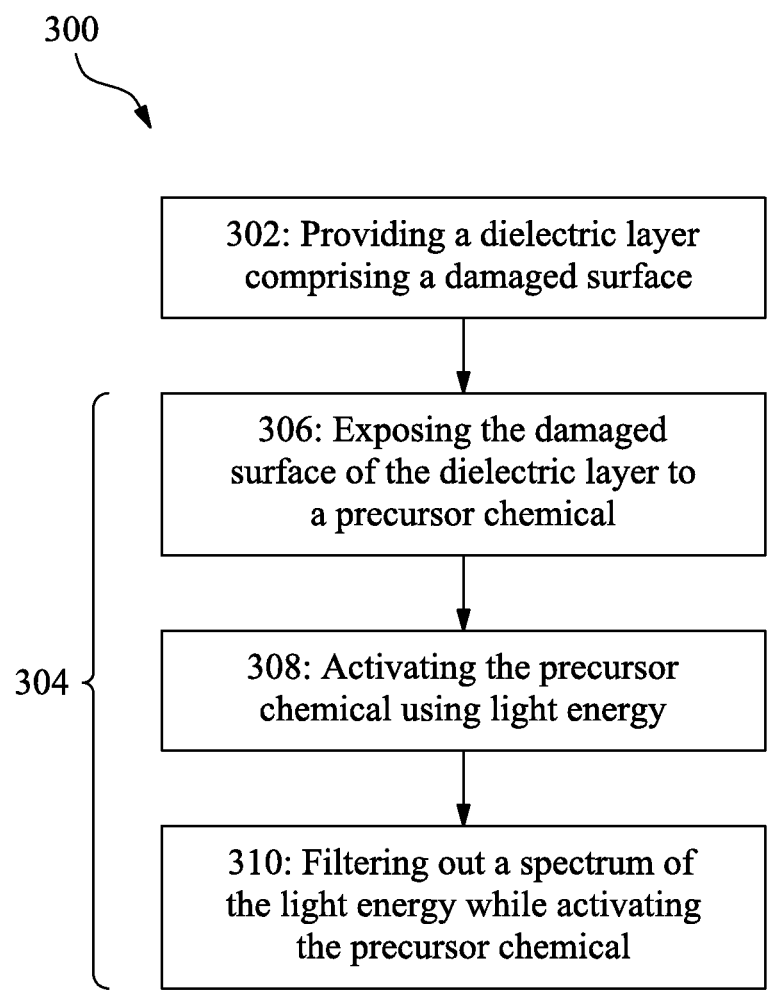
FIG. 12 illustrates a flow chart in accordance with some embodiments.

FIG. 12 illustrates a flow diagram 300 for repairing a damaged dielectric surface in accordance with some embodiments. In step 302, a dielectric layer having a damaged surface (e.g., damaged surface 104') is provided. In some embodiments, the damaged surface may be caused by processing of the dielectric layer (e.g., etching, CMP, and the like) during the fabrication of features in an semiconductor device (e.g., device 100). For example, processing of the dielectric layer may cause the formation of OH groups bonded with the dielectric material of the damaged surface.

Next, in step 304, the damaged surface is repaired. Step 304 may comprise various substeps 306 through 310. In step 306, the damaged surface is exposed to a precursor chemical (e.g., precursor chemical 106), which in some embodiments is a silicon and hydrogen containing organic compound (e.g., trimethylsilane, monomethylsilane, and the like). In step 308, the precursor chemical is activated using light energy (e.g., by applying ultraviolet light). The some embodiments, activation of the precursor chemical may include bending silicon and hydrogen/carbon bonds in the precursor chemical (e.g., as illustrated by FIGS. 7 and 8). The activated precursor chemical may then chemically react with the damaged surface in a repair operation (e.g., as illustrated by FIGS. 9 through 11). In order to eliminate (or at least reduce) undesired chemical reactions in undamaged portions of the dielectric layer, the supplied light energy may be filtered (e.g., by applying an optical filter 112). The portion of light energy filtered may depend on the precursor chemical and activation reaction used. For example, for the chemical reactions illustrated by FIGS. 7 through 8, photons having energy greater than about 3.1 eV or wavelengths less than about 400 nm may be filtered out during step 310. The activated precursor chemical reacts with the damaged surface in order to improve the chemical properties of and repair the damaged surface.

As described above, various embodiments include repairing a damaged dielectric surface by activating a precursor chemical using light energy (e.g., by supplying ultraviolet light). The activated precursor chemical reacts with the damaged surface of the dielectric layer to improve the damaged surface's chemical properties (e.g., by removing OH group bonds with the damaged surface's dielectric material). In some embodiments, the light energy used to activate the precursor chemical is filtered to selectively activate the precursor chemical while causing minimal (or at least fewer) chemical reactions in undamaged portions (e.g., unexposed portions) of the dielectric layer. Thus, a dielectric surface may be repaired while reducing the risk of further damage to the underlying, bulk dielectric material.

In accordance with an embodiment, a method for forming a semiconductor device includes providing a dielectric layer having a damaged surface and repairing the damaged surface of the dielectric layer. Repairing the damaged surface includes exposing the damaged surface of the dielectric layer to a precursor chemical, activating the precursor chemical using light energy, and filtering out a spectrum of the light energy while activating the precursor chemical.

In accordance with another embodiment, a method for forming a semiconductor device includes processing a dielectric layer, wherein processing the dielectric layer damages a surface of the dielectric layer. The method further includes flowing a precursor chemical over the surface of the dielectric layer, generating an activated precursor chemical by applying ultraviolet light energy to the precursor chemical, and using the activated precursor chemical to repair the surface of the dielectric layer. Applying the ultraviolet light energy includes filtering out a portion of the full ultraviolet light spectrum.

In accordance with yet another embodiment, a dielectric layer includes a bulk dielectric portion having a first density and a repaired surface portion over and contacting the bulk dielectric portion. The repaired surface portion has a second density, and a ratio of the second density to the first density is greater than about 1.9.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, the method comprising:
   providing a dielectric layer comprising a damaged surface; and
   repairing the damaged surface of the dielectric layer, wherein repairing the damaged surface comprises:
      exposing the damaged surface of the dielectric layer to a precursor chemical, wherein the precursor chemical comprises a silicon atom sharing a first bond with a hydrogen atom, and a second bond with a methyl group;
      activating the precursor chemical using light energy, wherein activating the precursor chemical triggers a self-decomposition reaction in the precursor chemical; and
      filtering out a spectrum of the light energy to produce a remaining light energy, wherein the remaining light energy triggers the self-decomposition reaction, and the remaining light energy comprises wavelengths greater than 400 nanometers (nm).

2. The method of claim 1, wherein filtering out the spectrum of the light energy comprises filtering out photons having energy greater than about 3.1 electron volts (eV).

3. The method of claim 1, wherein filtering out the spectrum of the light energy comprises removing photons having wavelengths less than about 400 nanometers (nm).

4. The method of claim 1, wherein using the light energy comprises ultraviolet light.

5. The method of claim 1, wherein repairing the damaged surface further comprises a dissociation byproduct comprising methane ($CH_4$).

6. The method of claim 1, wherein filtering out the spectrum of the light energy comprises applying an optical filter to a light source providing the light energy.

7. The method of claim 6, wherein the optical filter comprises a layer of titanium oxide (TiO).

8. A method for forming a semiconductor device, the method comprising:
   processing a dielectric layer, wherein processing the dielectric layer damages a surface of the dielectric layer;
   flowing a precursor chemical over the surface of the dielectric layer, wherein the precursor chemical comprises a silicon atom sharing a first covalent bond with a hydrogen atom, and the silicon atom further sharing a second covalent bond with a carbon atom;
   generating an activated precursor chemical by applying a light energy to the precursor chemical, wherein applying the light energy comprises filtering out ultraviolet wavelengths below 400 nanometers (nm), and wherein generating the activated precursor chemical comprises applying sufficient remaining light energy with wavelengths greater than 400 nm to bend an angle between the first covalent bond and the second covalent bond to trigger a self-decomposition reaction in the precursor chemical; and
   using the activated precursor chemical to repair the surface of the dielectric layer.

9. The method of claim 8, wherein filtering out ultraviolet wavelengths below 400 nm comprises removing photons having energy greater than about 3.1 electron volts (eV).

10. The method of claim 8, wherein bending an angle between the first covalent bond and the second covalent bond triggers the hydrogen atom and the carbon atom to bond and provide at least two radical sites on the silicon atom.

11. The method of claim 10, wherein the surface of the dielectric layer comprises an oxygen atom bonded to a second hydrogen atom, and wherein using the activated precursor chemical to repair the surface of the dielectric layer comprises inserting the silicon atom having the two radical sites between the oxygen atom and the second hydrogen atom.

12. The method of claim 8, wherein filtering out ultraviolet wavelengths below 400 nm comprises applying an optical filter to a source of the light energy.

13. The method of claim 12, wherein applying the optical filter to a source of the light energy comprises absorbing, by the optical filter, ultraviolet wavelengths below 400 nm.

14. The method of claim 12, wherein applying an optical filter to a source of the light energy comprises reflecting, by the optical filter, ultraviolet wavelengths below 400 nm.

15. The method of claim 8, wherein applying sufficient remaining light energy moves the first covalent bond and the second covalent bond reducing an angle subtended therebetween to decrease a distance between the carbon atom and the hydrogen atom.

16. The method of claim 12, wherein the optical filter comprises a layer of titanium oxide (TiO).

17. A method comprising:
   introducing a precursor chemical to a damaged surface of a low-k dielectric layer, wherein the precursor chemical comprises a silicon atom having a first bond with a hydrogen atom, the silicon atom having a second bond with a methyl group;
   producing a filtered light energy, the filtered light energy having wavelengths greater than 400 nanometers (nm); and
   activating the precursor chemical using the filtered light energy, wherein the filtered light energy triggers a self-decomposition reaction in the precursor chemical.

18. The method of claim 17 further comprising, producing a dissociation byproduct comprising methane ($CH_4$).

19. The method of claim 17, wherein the producing the filtered light energy comprises using an optical filter to produce the filtered light energy.

20. The method of claim 19, wherein the optical filter comprises a layer of titanium oxide (TiO).

* * * * *